United States Patent
Hongo

(10) Patent No.: US 10,073,147 B2
(45) Date of Patent: Sep. 11, 2018

(54) BATTERY STATE ESTIMATION DEVICE, BATTERY STATE MANAGEMENT SYSTEM, BATTERY, BATTERY STATE ESTIMATION METHOD, AND NON-TRANSITORY STORAGE MEDIUM

(71) Applicant: NEC Corporation, Tokyo (JP)

(72) Inventor: Hiroo Hongo, Tokyo (JP)

(73) Assignee: NEC Corporation, Tokyo (JP)

( * ) Notice: Subject to any disclaimer, the term of this patent is extended or adjusted under 35 U.S.C. 154(b) by 231 days.

(21) Appl. No.: 14/891,610

(22) PCT Filed: Mar. 27, 2014

(86) PCT No.: PCT/JP2014/058839
§ 371 (c)(1),
(2) Date: Nov. 16, 2015

(87) PCT Pub. No.: WO2014/185163
PCT Pub. Date: Nov. 20, 2014

(65) Prior Publication Data
US 2016/0084918 A1 Mar. 24, 2016

(30) Foreign Application Priority Data
May 16, 2013 (JP) ................................ 2013-104224

(51) Int. Cl.
*G01R 31/36* (2006.01)
(52) U.S. Cl.
CPC ....... *G01R 31/3679* (2013.01); *G01R 31/362* (2013.01); *G01R 31/3648* (2013.01); *G01R 31/3651* (2013.01); *G01R 31/3658* (2013.01)
(58) Field of Classification Search
CPC .............. G01R 31/3679; G01R 31/362; G01R 31/3648; G01R 31/3651; G01R 31/3658
See application file for complete search history.

(56) References Cited

U.S. PATENT DOCUMENTS

| 2010/0204861 | A1 | 8/2010 | Kaita et al. |
| 2016/0291092 | A1* | 10/2016 | Jonsson ............... G01R 31/362 |
| 2017/0012327 | A1* | 1/2017 | Mitsuyama ......... H01M 10/486 |

FOREIGN PATENT DOCUMENTS

| JP | 2005-106616 | 4/2005 |
| JP | 2009-100513 | 5/2009 |

(Continued)

OTHER PUBLICATIONS

International Search Report dated Jul. 1, 2014 in corresponding PCT International Application.

*Primary Examiner* — Pho M Luu
(74) *Attorney, Agent, or Firm* — Finnegan, Henderson, Farabow, Garrett & Dunner, L.L.P.

(57) ABSTRACT

The state of a battery parameter at the time of state estimation is estimated by using a plurality of pieces of parameter transition information (k, k+1), each piece of information representing an aspect of a temporal change in the battery parameter and representing the aspect of the temporal change until a predetermined state is achieved after a predetermined time that has elapsed from an initial state for each of use environments of a battery, and use environment information representing the use environment of the battery from the time of the start of use to the time of state estimation. In a case where the use environment of the battery is transited from a k-th use environment to a (k+1)-th use environment, a battery parameter $p_k$ after being used in the k-th use environment is calculated by using the parameter transition information k corresponding to the k-th use environment, and thereafter a battery parameter $p_{k+1}$ after the battery in the state of the battery parameter $p_k$ is used in the (k+1)-th use environment is calculated by using the parameter transition information k+1 corresponding to the (k+1)-th use environment.

13 Claims, 13 Drawing Sheets

(56) References Cited

FOREIGN PATENT DOCUMENTS

| | | |
|---|---|---|
| JP | 2010-217070 | 9/2010 |
| JP | 4649682 | 3/2011 |

* cited by examiner

FIG. 3

| date time | | mode | temp. /°C | cell voltage /V | | current |
|---|---|---|---|---|---|---|
| from | to | | | min | max | |
| 20xx/y/zz 23:00 | 20xx/y/ww 03:00 | charge | 13 | 3.0 | 4.1 | 0.3C |
| 20xx/y/ww 03:00 | 20xx/y/ww 07:00 | rest | 17 | 4.1 | 4.1 | - |
| 20xx/y/ww 07:00 | 20xx/y/ww 09:30 | discharge | 20 | 3.95 | 4.1 | 0.2C |
| 20xx/y/ww 09:30 | 20xx/y/ww 11:30 | rest | 23 | 3.95 | 3.95 | - |
| 20xx/y/ww 11:30 | 20xx/y/ww 13:30 | discharge | 24 | 3.0 | 3.95 | 0.25C |
| 20xx/y/ww 13:30 | 20xx/y/ww 23:00 | rest | 20 | 3.0 | 3.0 | - |
| ... | ... | ... | ... | ... | ... | ... |

US 10,073,147 B2

BATTERY STATE ESTIMATION DEVICE, BATTERY STATE MANAGEMENT SYSTEM, BATTERY, BATTERY STATE ESTIMATION METHOD, AND NON-TRANSITORY STORAGE MEDIUM

CROSS-REFERENCE TO RELATED PATENT APPLICATIONS

This application is a National Stage Entry of International Application No. PCT/JP2014/058839, filed Mar. 27, 2014, which claims priority from Japanese Patent Application No. 2013-104224, filed May 16, 2013. The entire contents of the above-referenced applications are expressly incorporated herein by reference.

TECHNICAL FIELD

The present invention relates to a battery state estimation device, a battery state management system, a battery, a battery state estimation method, and a program.

BACKGROUND ART

With the recent technological developments, a large-sized lithium-ion secondary battery for power storage as well as for an electric vehicle has been utilized. Such large-sized lithium-ion secondary batteries for power storage are installed in houses, offices, premises of electric power companies, or the like, and an operation lifetime of 10 years is postulated.

For the large-sized lithium-ion secondary battery in which a usage lifetime of 10 years is expected, the battery state thereof needs to be monitored due to maintenance and management. For example, constant monitoring of temperature is important as information for determining the absence or presence of abnormality such as heat generation. In addition, monitoring of an available battery capacity value is necessary as information for determining the necessity or needlessness of a battery maintenance operation.

It is known that deterioration progresses with use in the lithium-ion secondary battery and the available battery capacity decreases. In a case where the battery capacity is reduced faster than assumed due to certain abnormality, or in a case where the battery capacity is reduced lower than the guaranteed capacity within a guaranteed period, maintenance or replacement is necessary.

As the simplest battery capacity monitoring method, a method of fully charging a battery and thereafter fully discharging the battery has been considered. Full charge and full discharge of the battery only for the monitoring of the battery capacity is a waste of electricity, and there is a problem in that a user cannot use the battery in the meantime. In a case of employing the method, it is preferable that the battery capacity is monitored through everyday use (charge and discharge) by the user. However, there is a problem in that for some users, it is rare that the battery is used to the point of full discharge. For example, there is a user who uses a battery while always ensuring a power of SOC=30% or higher. Here, SOC stands for State of Charge and means a charge rate. In addition, there may be a case where, depending on the user, charge is newly performed while full discharge is not reached due to a small amount of power used in the daytime.

As another battery capacity monitoring method, a method of estimating a deterioration amount by analyzing the log data of a lithium-ion secondary battery, that is, a discharge curve or a charge curve may be considered. However, the charge or discharge curve needs to be acquired with high accuracy to a certain degree, and even in this method, full discharge after full charge or charge after full discharge is preferable. Therefore, the same problems as those in the above-described method are present.

As another battery capacity monitoring method, a method of estimating an amount of reduced battery capacity by measuring an impedance or resistance value may be considered. However, in this method, a measurement mechanism other than mechanisms for measuring current, voltage, and power needs to be provided, and this causes an increase in costs.

In Patent Document 1, a method is disclosed of estimating three parameters including the active material retention rate at each of positive and negative electrodes and a variation capacity corresponding to the compositions of the positive and negative electrodes, and estimating the full charge capacity of a deteriorated battery using the estimated parameters.

RELATED DOCUMENT

Patent Document

[Patent Document 1] Japanese Patent No. 4649682

SUMMARY OF THE INVENTION

An object of the present invention is to provide a new method of estimating a deteriorated state of a parameter used to estimate a deteriorated battery capacity.

According to the present invention, there is provided a battery state estimation device including:

a transition information storage unit which stores a plurality of pieces of parameter transition information, each piece of the parameter transition information representing an aspect of a temporal change in a battery parameter that is changed in its state with time, the change in state influencing a battery capacity, and each piece of the parameter transition information representing the aspect of the temporal change until a predetermined state is achieved after a predetermined time that has elapsed from an initial state for each of use environments of a battery;

a use environment acquisition unit which acquires use environment information representing the use environment of a target battery which is a target of state estimation from a time of a start of use to a time of state estimation; and a parameter estimation unit which estimates the state of the battery parameter of the target battery at the time of state estimation, by using the use environment information and the parameter transition information, in which, in a case where the use environment of the target battery from the time of the start of use to the time of state estimation is changed from a first use environment to an N-th use environment (where N is an integer of 2 or more) in this order (where a P-th use environment and a (P+1)-th use environment are different use environments, and P is an integer of 1 or more and (N−1) or less), the parameter estimation unit is caused to perform a process of using the parameter transition information corresponding to the P-th use environment to estimate a P-th state which is the state of the battery parameter at a time of an end of the P-th use environment in a case where the battery parameter is used in the P-th use environment, and thereafter, using the parameter transition information corresponding to the (P+1)-th use environment to estimate a (P+1)-th state which is the state of the battery parameter at a time of an end of the (P+1)-th use environment in a case where the battery parameter in the P-th state is used in the (P+1)-th use environment, to thereby estimate an N-th state which is the state of the battery parameter at the time of an end of the N-th state and estimate the estimated N-th state as the state of the battery parameter of the target battery at the time of state estimation.

In addition, according to the present invention, there is provided a battery state management system including the battery state estimation device which is provided in a housing different from that of the target battery and is configured to communicate with the target battery, and in which the use environment acquisition unit acquires the use environment information from the target battery, and the target battery.

In addition, according to the present invention, there is provided a battery including the battery state estimation device.

In addition, according to the present invention, there is provided a battery state estimation method which causes a computer to store a plurality of pieces of parameter transition information, each piece of the parameter transition information representing an aspect of a temporal change in a battery parameter that is changed in its state with time, the change in state influencing a battery capacity, and each piece of the parameter transition information representing the aspect of the temporal change until a predetermined state is achieved after a predetermined time that has elapsed from an initial state for each of use environments of a battery, and to execute a use environment acquisition step of acquiring use environment information representing the use environment of a target battery which is a target of state estimation from a time of a start of use to a time of state estimation; and a parameter estimation step of estimating the state of the battery parameter of the target battery at the time of state estimation, by using the use environment information and the parameter transition information, in which, in the parameter estimation step, in a case where the use environment of the target battery from the time of the start of use to the time of state estimation is changed from a first use environment to an N-th use environment (where N is an integer of 2 or more) in this order (where a P-th use environment and a (P+1)-th use environment are different use environments, and P is an integer of 1 or more and (N−1) or less), a process of using the parameter transition information corresponding to the P-th use environment to estimate a P-th state which is the state of the battery parameter at a time of an end of the P-th use environment in a case where the battery parameter is used in the P-th use environment, and thereafter, using the parameter transition information corresponding to the (P+1)-th use environment to estimate a (P+1)-th state which is the state of the battery parameter at a time of an end of the (P+1)-th use environment in a case where the battery parameter in the P-th state is used in the (P+1)-th use environment is used, to thereby estimate an N-th state which is the state of the battery parameter at a time of an end of the N-th use environment and estimate the estimated N-th state as the state of the battery parameter of the target battery at the time of state estimation.

In addition, according to the present invention, there is provided a program which causes a computer to function as a transition information storage unit which stores a plurality of pieces of parameter transition information, each piece of the parameter transition information representing an aspect of a temporal change in a battery parameter that is changed in its state with time, the change in state influencing a battery capacity, and each piece of the parameter transition information representing the aspect of the temporal change until a predetermined state is achieved after a predetermined time that has elapsed from an initial state for each of use environments of a battery;

a use environment acquisition unit which acquires use environment information representing the use environment of a target battery which is a target of state estimation from a time of a start of use to a time of state estimation; and a parameter estimation unit which estimates the state of the battery parameter of the target battery at the time of state estimation, by using the use environment information and the parameter transition information, in which, in a case where the use environment of the target battery from the time of the start of use to the time of state estimation is changed from a first use environment to an N-th use environment (where N is an integer of 2 or more) in this order (where a P-th use environment and a (P+1)-th use environment are different use environments, and P is an integer of 1 or more and (N−1) or less), the parameter estimation unit is caused to perform a process of using the parameter transition information corresponding to the P-th use environment to estimate a P-th state which is the state of the battery parameter at a time of an end of the P-th use environment in a case where the battery parameter is used in the P-th use environment, and thereafter, using the parameter transition information corresponding to the (P+1)-th use environment to estimate a (P+1)-th state which is the state of the battery parameter at a time of an end of the (P+1)-th use environment in a case where the battery parameter in the P-th state is used in the (P+1)-th use environment, to thereby estimate an N-th state which is the state of the battery parameter at a time of an end of the N-th use environment and estimate the estimated N-th state as the state of the battery parameter of the target battery at the time of state estimation.

According to the present invention, a new method of estimating a state of a deteriorated parameter used to estimate a deteriorated battery capacity is realized. In this method, it is possible to estimate the battery state deteriorated due to a complex operation, by using a minimal amount of necessary data without a process of acquiring a large amount of comprehensive data in advance.

BRIEF DESCRIPTION OF THE DRAWINGS

The above and other objects, features, and advantages will become more apparent from the following preferred embodiments and the accompanying drawings.

FIG. 3 is a view schematically showing an example of use environment information.

DESCRIPTION OF EMBODIMENTS

Figure 1:
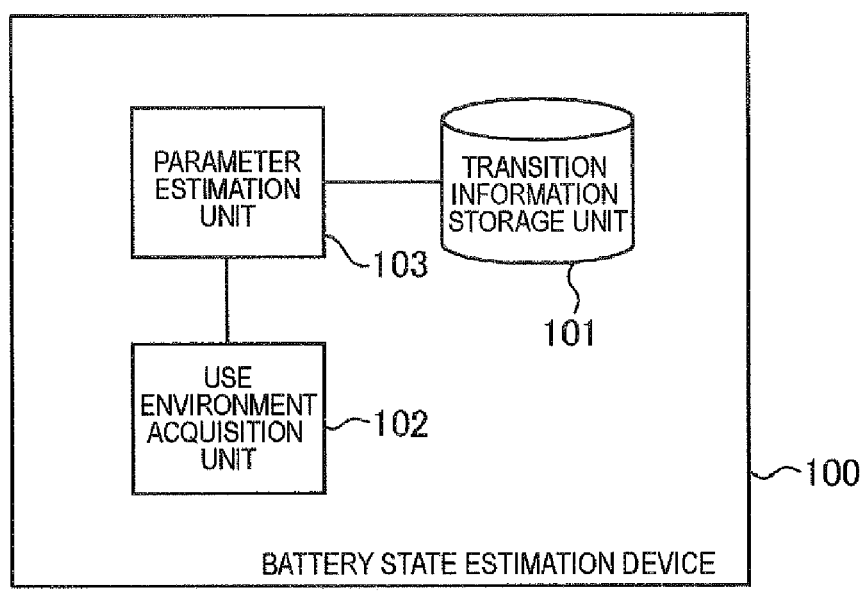
FIG. 1 shows an example of the function block diagram of a battery state estimation device of an embodiment.

Hereinafter, embodiments of the present invention will be described with reference to the drawings. Devices of the embodiments and each unit included in the devices are realized by an arbitrary combination of a central processing unit (CPU) of an arbitrary computer, a memory, a program (including, as well as a program stored in advance in a memory in the stage of shipment of a device, a program downloaded from a storage medium such as a compact disc (CD) or a server over the Internet) loaded on the memory, a storage unit such as a hard disk that stores the program, and hardware and software based on network connection interfaces. In addition, it is understood by those skilled in the art that the realization methods and the devices have various modification examples.

Function block diagrams used in the description of the embodiments show blocks in units of functions other than hardware configuration. In the drawings, each device is shown to be realized in a single apparatus, but the realization method is not limited thereto. That is, a physically divided configuration or logically divided confirmation may also be realized.

First Embodiment

FIG. 1 shows an example of the function block diagram of a battery state estimation device 100 of an embodiment. As shown, the battery state estimation device 100 includes a transition information storage unit 101, a use environment acquisition unit 102, and a parameter estimation unit 103.

The battery state estimation device 100 may be provided in a target battery which is a target of state estimation. As another example, the battery state estimation device 100 may also be provided in a housing different from that of the target battery. In the case where the battery state estimation device 100 is provided in the housing different from that of the target battery, the battery state estimation device 100 may be configured to communicate with the target battery through a wire or wirelessly. In this embodiment, a target battery having a battery state estimation device is also disclosed. In addition, a battery state management system may include a single one of or a plurality of target batteries and a battery state estimation device which communicates with the target batteries and estimates the states of the target batteries.

The transition information storage unit 101 shown in FIG. 1 stores a plurality of pieces of parameter transition information. The parameter transition information is information representing the aspect of temporal changes in battery parameters. The battery parameters are changed in state with time and the changes in state influence the battery capacity. The parameter transition information represents the aspect of a temporal change from an initial state to second state. The second state is a state after a certain time has elapsed from the initial state. The plurality of pieces of parameter transition information respectively represent the aspects of temporal changes in battery parameters in different use environments in which the battery is used. That is, a first piece of parameter transition information represents the aspect of temporal changes in the battery parameters until a predetermined state is achieved after a predetermined time that has elapsed from an initial state in a case of use in a first use environment. A second piece of parameter transition information represents the aspect of temporal changes in the battery parameters until a predetermined state is achieved after a predetermined time that has elapsed from an initial state in a case of use in a second use environment.

For example, the battery parameters include at least one of an active material amount (the amount of an active material that contributes to charge and discharge), a mobile lithium ion amount (the amount of lithium ions that contribute to charge and discharge), and the stoichiometric ratio of lithium ions to the positive and negative electrode active materials. It is known that these parameters are changed (deteriorated) in state with time and the changes in state influence the battery capacity, or the aspects of the changes in state vary depending on the use environment. The battery parameters are not limited to the above-mentioned examples and include all battery parameters which are changed instate with time and of which the changes instate influence the battery capacity. The battery parameters may also be parameters of which the aspects of the changes in state vary depending on the use environment.

The parameter transition information is generated in advance by the user based on experimental results, simulation results, and the like. The parameter transition information generated by the user is stored in the transition information storage unit 101. The user generates the plurality of parameter transition information respectively corresponding to a plurality of use environments with varying use environment factors which may influence the progress of deterioration of the battery parameters. As the use environment factors, for example, use states (charge and discharge states and a pause state in which charge or discharge is not performed (excluding natural discharge)), temperature, use environments (current and voltage) in the charge and discharge states, and the like are considered. The use environment factors are not limited to the above-mentioned examples.

Figure 2:
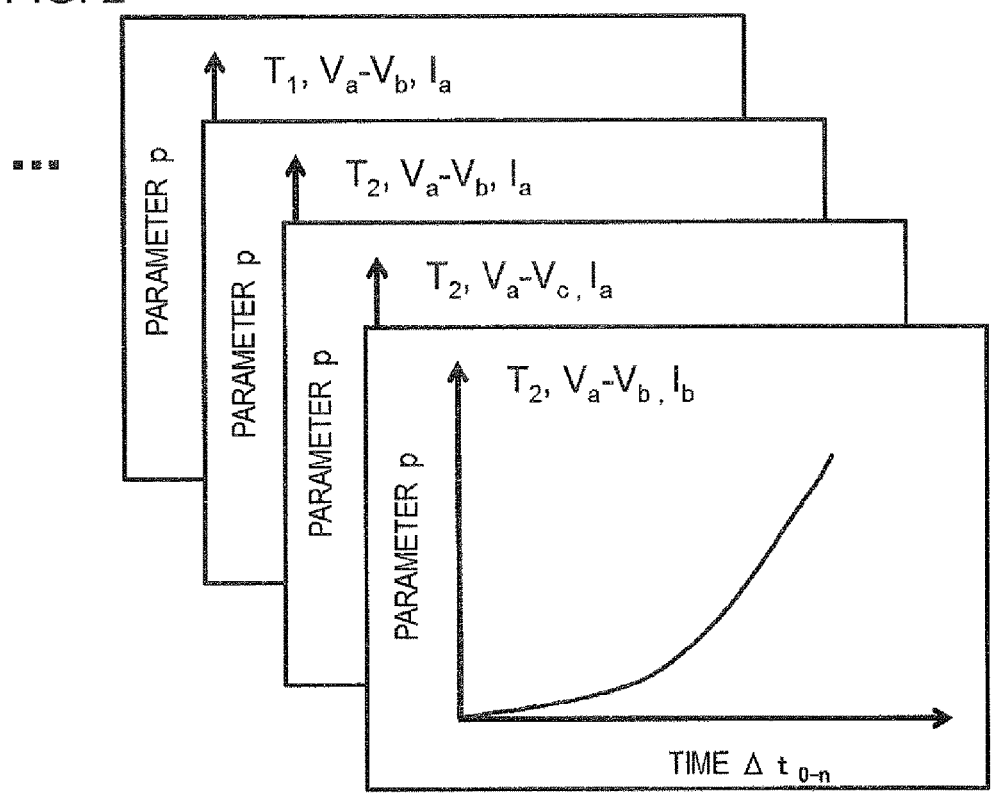
FIG. 2 is a view schematically showing an example of parameter transition information (parameter transition profiles).

FIG. 2 schematically shows an example of the parameter transition information. The shown parameter transition information takes the elapsed time $\Delta t_{0-n}$ from the start of use in the horizontal axis and takes the state of a battery parameter in the vertical axis. In a case of the shown example, the state of a battery parameter in the vertical axis represents the rate of change from the initial state, and otherwise, the amount of change or the like may also be employed. The first piece of parameter transition information (in the figure, parameter transition information is positioned in front) shown in FIG. 2 represents the rate of change in the battery parameter with time when the battery is charged or discharged at a temperature of $T_2$, in a voltage range of $V_a$ to $V_b$, with a current of $I_b$. The second piece of parameter transition information (in the figure, parameter transition information at a second position from the front) represents the rate of change in the battery parameter with time when the battery is charged or discharged at a temperature of $T_2$, in a voltage range of $V_a$ to $V_c$, with a current of $I_a$. The transition information storage unit 101 stores each of the plurality of pieces of parameter transition information in association with information that represents the corresponding use environment (including information that specifies the details of the use environment factors). As described above, the transition information storage unit 101 may store parameter transition information for each of the plurality of use environments in which at least one of a current value, a voltage value, and a temperature differs from that in another use environment. In addition, the transition information storage unit 101 may store parameter transition information for each of various use states (charge and discharge states and a pause state).

Returning to FIG. 1, the use environment acquisition unit 102 acquires use environment information representing a use environment of a target battery which is a target of state estimation from the time of the start of use to the time of state estimation. For example, the target battery is a lithium-ion secondary battery. The target battery may also be a stationary storage battery which uses a lithium-ion secondary battery installed in houses, stores, offices, factories, or substations, a storage battery which uses a lithium-ion secondary battery used in satellites, or the like. The use environment information acquired by the use environment acquisition unit 102 includes information representing each of use environment factors (use states, temperature, voltage, and current) corresponding to the parameter transition information stored in the transition information storage unit 101. The environment information also includes information representing the use time (start time and finish time).

A method of acquiring the use environment information by the use environment acquisition unit 102 is not particularly limited. In a case where the battery state estimation device 100 is provided in the target battery, the use environment acquisition unit 102 may acquire use environment information from a battery management unit (BMU) in the target battery and store the acquired information in a storage device. In a case where the battery state estimation device 100 is provided in a housing different from that of the target battery, the use environment information may also be acquired by a user input, or the use environment information may also be acquired from the target battery through communication with the target battery.

FIG. 3 schematically shows an example of the use environment information. The shown use environment information includes columns of "data time", "mode", "temperature", "cell voltage", and "current". In the column of "mode", the use states (charge: the charge state, discharge: the discharge state, pause: the pause state) are shown, in the column of "temperature", the value of a cell temperature is shown, in the column of "cell voltage", the maximum value and the minimum value of a cell voltage are shown, and in the column of "current", a current value is shown. In the column of "data time", the start time and the finish time of each state are shown.

According to the use environment information shown in FIG. 3, it is seen that the target battery is started to be used at 23:00 in 20xx/y/zz, and is charged until 03:00 on 20xx/y/ww at a temperature 13° C. in a voltage range of 3.0 V to 4.1 V with a current of 0.3 C. It is seen that the target battery enters a pause state thereafter until 07:00 on 20xx/y/ww at a temperature 17° C. in a voltage range of 4.1 V to 4.1 V. It is seen that the target battery is discharged therefrom until 09:30 on 20xx/y/ww at a temperature 20° C. in a voltage range of 3.95 V to 4.1 V with a current of 0.2 C. It is seen that the state is thereafter changed to the pause state, the discharge state, and the pause state. The current is shown in C-rate (a current value standardized by a cell rated capacity value (Ah)).

The use environment acquisition unit 102 which acquires the use environment information as shown in FIG. 3 acquires, as the use environment information, information representing a transition in the charge and discharge states and the pause state from the time of the start of use to the time of state estimation. The use environment acquisition unit 102 acquires, as the use environment information, information representing at least one transition in the current value, the voltage value, and the temperature from the time of the start of use to the time of state estimation.

Returning to FIG. 1, the parameter estimation unit 103 estimates the state of the battery parameter of the target battery (for example, the amount of change and/or the rate of change in the battery parameter from the time of the start of use to the time of state estimation of the target battery) at the time of state estimation, by using the use environment information acquired by the use environment acquisition unit 102 and the parameter transition information stored in the transition information storage unit 101. For example, the time of state estimation is a time point at which use in all of use environments specified by the use environment information is ended.

For example, in a case where the use environment of the target battery specified by the use environment information is maintained in a use environment (for example, a pause state at a temperature of 17° C. in a voltage range of 4.1 V to 4.1 V) from the time of the start of use to the time of state estimation (in a case of no change in the use environment), the parameter estimation unit 103 estimates the state of battery parameter at the time of state estimation as follows.

First, the parameter estimation unit 103 acquires parameter transition information (see FIG. 2) from the transition information storage unit 101, the transition information corresponding to the associated use environment. The parameter estimation unit 103 figures out the elapsed time $\Delta t_a$ by using the use environment information. The elapsed time $\Delta t_a$ is an elapsed time during which target battery is maintained in the use environment. Thereafter, parameter estimation unit 103 figures out the state of the battery parameter (the value of p at the time of $\Delta t_{0-n} = \Delta t_a$) by using the acquired parameter transition information. The state of the battery parameter (the value of p at the time of $\Delta t_{0-n} = \Delta t_a$) is a state of battery parameter after the battery parameter in the initial state is used for a time period $\Delta t_a$ in the corresponding use environment.

On the other hand, as shown in FIG. 3, there is a case that the use environment of the target battery figured out by the use environment information is subjected to a transition between a plurality of use environments from the time of the start of use to the time of state estimation. That is, There is a case that the use environment of the target battery from the time of the start of use to the time of state estimation is changed from a first use environment to an N-th use environment (where N is an integer of 2 or more) in this order (where a P-th use environment and a (P+1)-th use environment are different use environments, and P is an integer of 1 or more and (N−1) or less). The parameter estimation unit 103 uses "a process of using the parameter transition information corresponding to the P-th use environment to estimate a P-th state which is the state of the battery parameter at the time of the end of the P-th use environment in a case where the battery parameter is used in the P-th use environment, and thereafter using the parameter transition information corresponding to the (P+1)-th use environment to estimate a (P+1)-th state which is the state of the battery parameter at the time of the end of the (P+1)-th use environment in a case where the battery parameter in the P-th state is used in the (P+1)-th use environment". The parameter estimation unit 103 estimates an N-th state which is the state of the battery parameter at the time of the end of the N-th use environment by using the process. The parameter estimation unit 103 estimates the estimated N-th state is the state of the battery parameter of the target battery at the time of state estimation.

More specifically, first, the parameter estimation unit 103 acquires the parameter transition information corresponding to the first use environment (a first piece of parameter transition information) from the transition information storage unit 101 in a case where the use environment of the target battery from the time of the start of use to the time of state estimation is changed from the first use environment to the N-th use environment (where N is an integer of 2 or more) in this order (where the P-th use environment and the (P+1)-th use environment are different use environments, and P is an integer of 1 or more and (N−1) or less). In addition, the parameter estimation unit 103 figures out the elapsed time $\Delta t_1$ during which the target battery is maintained in the first use environment by using the use environment information. Thereafter, the parameter estimation unit 103 figures out the state of the battery parameter (the value of p at the time of $\Delta t_{0-n}=\Delta t_1$) by using the acquired first piece of parameter transition information. The state of the battery parameter (the value of p at the time of $\Delta t_{0-n}=\Delta t_1$) is a state of the battery parameter after the battery parameter in the initial state is used for a time period $\Delta t_1$ in the first use environment. Hereinafter, the state of the battery parameter figured out here is referred to as a first state, and the value of p figured out here is referred to as $p_1$.

Thereafter, the parameter estimation unit 103 estimates the N-th state which is the state of the battery parameter at the time of the end of the N-th use environment by performing a process of using parameter transition information corresponding to a Q-th use environment to estimate a Q-th state which is the state of the battery parameter at the time of the end of the Q-th use environment in a case where the battery parameter in a (Q−1)-th state is used in the Q-th use environment once, by setting Q=2 (in a case of N=2), or repeating the process while increasing the value of Q by 1 from Q=2 until Q=N is achieved (in a case of N≥3). The parameter estimation unit 103 estimates estimated N-th state is the state of the battery parameter of the target battery at the time of state estimation.

That is, after figuring out the first state ($p_1$), the parameter estimation unit 103 acquires parameter transition information (a second piece of parameter transition information) corresponding to a second use environment (the use environment just after the first use environment) from the transition information storage unit 101. In addition, the parameter estimation unit 103 figures out the elapsed time $\Delta t_2$ during which the target battery is maintained in the second use environment by using the use environment information. Thereafter, the parameter estimation unit figures out the state of the battery parameter (a second state $p_2$) by using the acquired second piece of parameter transition information. The state of the battery parameter (a second state $p_2$) is a state of battery parameter after the battery parameter in the first state is used for a time period $\Delta t_2$ in the second use environment.

For example, first, the parameter estimation unit 103 figures out $\Delta t_{0-n}(=\Delta t1')$ at $p=p_1$ by using the second piece of parameter transition information. Thereafter, the value of p at the time of $\Delta t_{0-n}=\Delta t1'+\Delta t_2$ is calculated as $p_2$ by using the second parameter transition information.

In the case of N=2, $p_2$ is the state of the battery parameter of the target battery at the time of state estimation. On the other hand, in the case where N is 3 or more, by using a third piece of parameter transition information corresponding to the second state ($p_2$) and a third use environment and the elapsed time $\Delta t_3$ during which the target battery is maintained in the third use environment, the parameter estimation unit 103 estimates the state of the battery parameter (a third state $p_3$). The state of the battery parameter (a third state $p_3$) is a parameter after the battery parameter in the second state is used for the time period $\Delta t_3$ in the third use environment in the same manner. Thereafter, the parameter estimation unit 103 repeats the same process as necessary to figure out the N-th state ($p_3$), and the state is estimated as the state of the battery parameter of the target battery at the time of state estimation.

Figure 4:
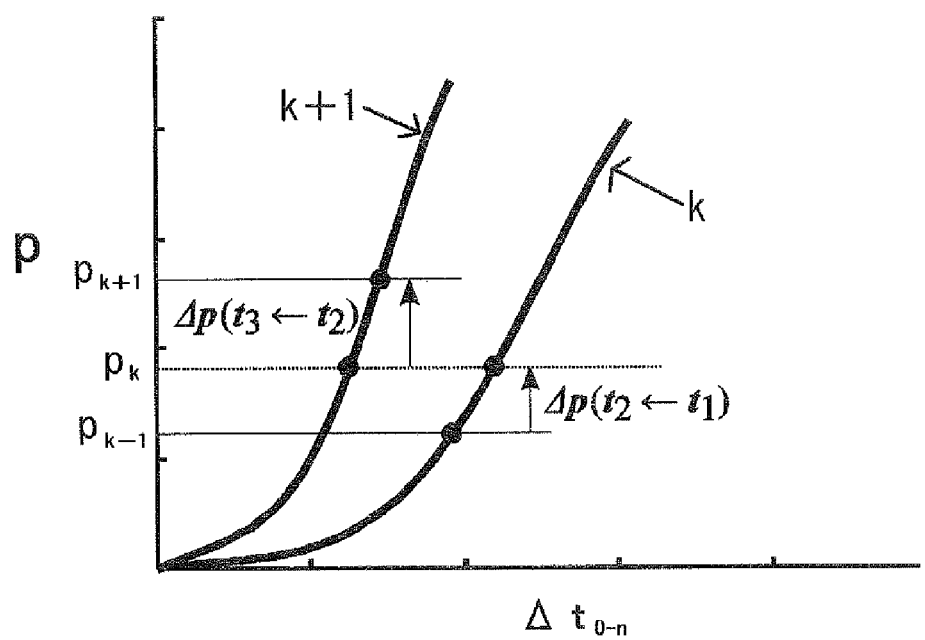
FIG. 4 is a view showing a process of a parameter estimation unit.

Here, the contents of the process are visually shown in FIG. 4. It is assumed that the target battery is used in a k-th use environment (k is an integer of 2 or more and (N−1) or less) in a period from a time $t_1$ to a time $t_2$, and is thereafter used in a (k+1)-th use environment in a period from a time $t_2$ to a time $t_3$. The FIG. 4 shows a k-th piece of parameter transition information corresponding to the k-th use environment and a (k+1)-th piece of parameter transition information corresponding to the (k+1)-th use environment.

First, by using the k-th piece of parameter transition information and a (k−1)-th state ($p=p_{k-1}$) which is the state of the battery parameter after being used in a (k−1)-th use environment, the parameter estimation unit 103 figures out the state of battery parameter (a k-th state $p_k$). The state of the battery parameter (a k-th state $p_k$) is a state of battery parameter after the battery parameter in the (k−1)-th state is used for a time period $\Delta t(=t_2-t_1)$ in the k-th use environment. Thereafter, by using a k-th state ($p=p_k$) which is the state of the battery parameter after being used in the k-th use environment and a (k+1)-th piece of parameter transition information, the parameter estimation unit 103 specifies the state of battery parameter (a (k+1)-th state $p_{k+1}$) after the battery parameter in the k-th state is used for a time period $\Delta t(=t_3-t_2)$ in the (k+1)-th use environment.

According to the battery state estimation device 100 of this embodiment described above, a new method of estimating the state of a deteriorated parameter (battery parameter) used to estimate the state of the deteriorated battery capacity is realized. According to the battery state estimation device 100 of this embodiment, it is possible to estimate the state of the deteriorated battery parameter through a relatively easy computational process. Accordingly, without a process of acquiring a large amount of comprehensive data in advance, it is possible to estimate a battery state deteriorated due to a complex operation, by using a minimal amount of necessary data.

Second Embodiment

Figure 5:
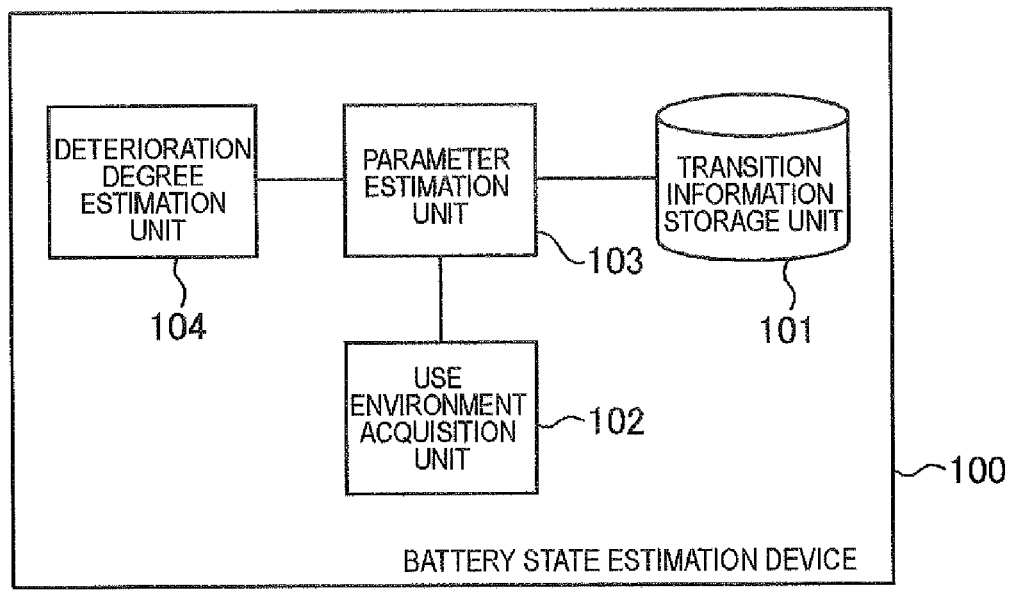
FIG. 5 shows an example of the function block diagram of the battery state estimation device of the embodiment.

A battery state estimation device in this embodiment is different from the battery state estimation device of the first embodiment in that a deterioration degree estimation unit 104 is provided. FIG. 5 shows an example of the function block diagram of the battery state estimation device of this embodiment. As shown, a battery state estimation device 100 of this embodiment includes a transition information storage unit 101, a use environment acquisition unit 102, a parameter estimation unit 103, and the deterioration degree estimation unit 104. The configurations of the transition information storage unit 101 and the use environment acquisition unit 102 are the same as those of the first embodiment.

Thus the description thereof will not be repeated. Hereinafter, the parameter estimation unit 103 and the deterioration degree estimation unit 104 will be described.

The parameter estimation unit 103 can calculate the rate of change and/or the amount of change in a battery parameter as in the first embodiment. Furthermore, the parameter estimation unit 103 can estimate the value of the battery parameter itself based on the estimated rate of change and/or the amount of change. For example, the parameter estimation unit 103 stores the initial value of the battery parameter in advance. The initial value of the battery parameter may use a calculated value based on the design of each target battery or the like. The parameter estimation unit 103 calculates the value of the battery parameter at the time of state estimation by using the initial value of the battery parameter stored in advance and the estimated state of the battery parameter (the rate of change and/or the amount of change in the battery parameter) at the time of state estimation.

The deterioration degree estimation unit 104 estimates the degree of deterioration of the battery capacity of a target battery based on the estimated state of the battery parameter at the time of state estimation. For example, the deterioration degree estimation unit 104 calculates the battery capacity of the target battery at the time of state estimation by using the value of the battery parameter estimated by the parameter estimation unit 103. The value of the battery parameter is estimated by the parameter estimation unit 103 based on the estimated state of the battery parameter at the time of state estimation. Thereafter, the deterioration degree estimation unit 104 may calculate the deterioration rate of the battery capacity by using the calculated battery capacity of the target battery at the time of state estimation and the battery capacity of the target battery in the initial state stored in advance. A method of calculating the battery capacity of the target battery at the time of state estimation using the value of the battery parameter is not particularly limited, and an example thereof will be described in the following embodiment.

Figure 6:
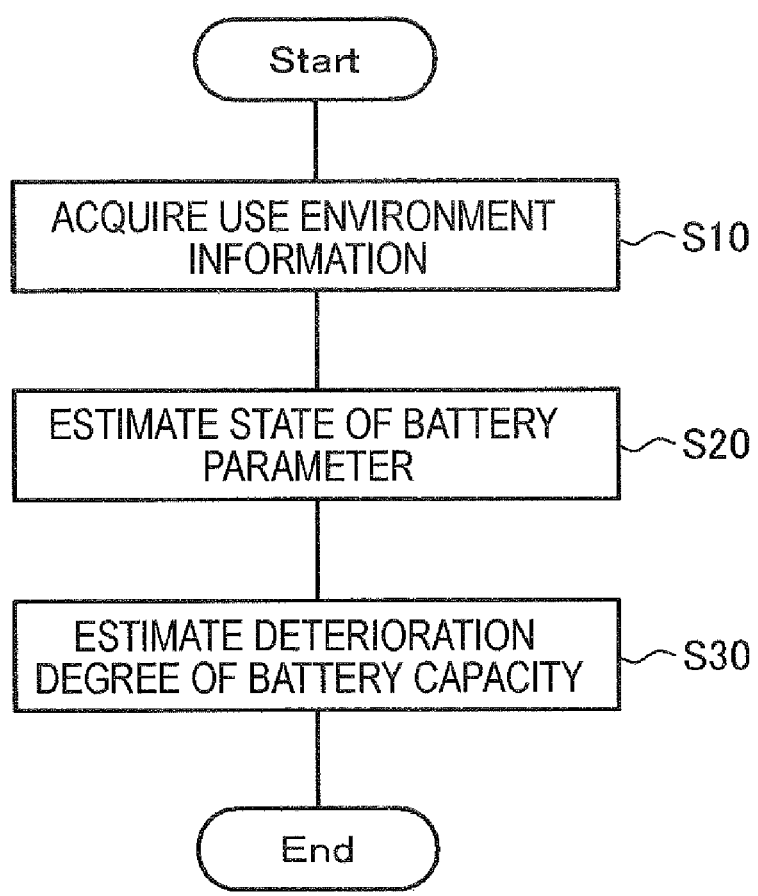
FIG. 6 is a flowchart showing an example of the flow of a process of the battery state estimation device of the embodiment.

Next, an example of the flow of a process of a battery state estimation method executed by the battery state estimation device in this embodiment will be described by using a flowchart of FIG. 6.

In S10, the use environment acquisition unit 102 acquires use environment information. The use environment information represents the use environment of the target battery from the time of the start of use to the time of state estimation. In S20, the parameter estimation unit 103 estimates the state of the battery parameter of the target battery at the time of state estimation, by using the use environment information acquired in S10 and parameter transition information stored in the transition information storage unit 101. In S30, the deterioration degree estimation unit 104 estimates the degree of deterioration of the battery capacity of the target battery based on the state of the battery parameter estimated in S20.

According to the battery state estimation device 100 of this embodiment described above, the effects described in the first embodiment can be realized. In addition, a new method for estimating a deteriorated battery capacity is realized.

Third Embodiment

Next, an embodiment in which the battery state estimation devices 100 of the first and second embodiments are embodied will be described in detail with reference to the drawings.

Figure 7:
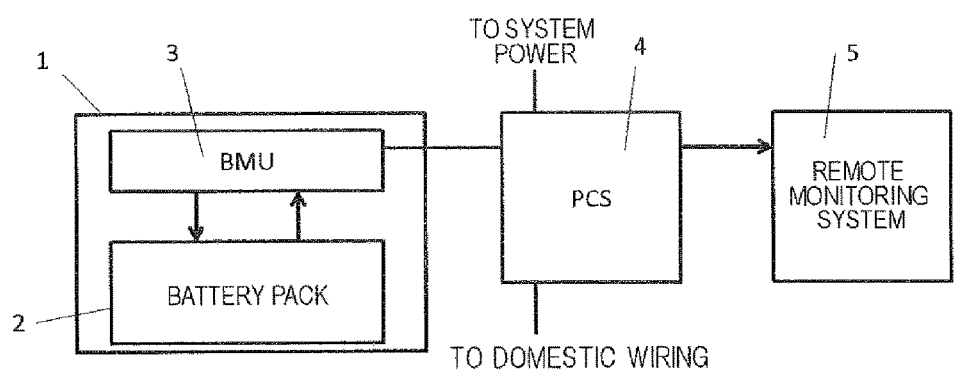
FIG. 7 shows an example of the function block diagram of a battery state management system of the embodiment.

FIG. 7 shows an example of the function block diagram of a battery state management system of this embodiment. In the example, a target battery and the battery state estimation device are provided in different housings and are able to communicate with each other.

A lithium-ion secondary battery (the target battery) is configured to include a housing 1, a battery pack 2, a BMU 3 which controls the battery, a power control system (PCS) 4, and the like.

The battery pack 2 is constituted by a plurality of modules including several to about 20 battery cells. In each module, battery cells are connected in series or in parallel. A lithium-ion secondary battery can acquire a voltage value for each cell from a voltage monitor. The lithium-ion secondary battery can acquire charge and discharge current values from a current monitor through the cells connected in series. Depending on the implementation of a cell balancing circuit, the lithium-ion secondary battery may monitor the charge and discharge current values for each cell.

The BMU 3 monitors the voltage and current monitors, a temperature monitor, and the like for each battery cell. The BMU 3 secures safety of charging and discharging while communicating with the PCS 4. As necessary, the BMU 3 may perform cell balancing of the cells in series. For example, the BMU 3 monitors whether or not the voltage of each cell is appropriate or whether or not the current amounts during charging and discharging are in acceptable ranges. There is a case that the voltage of a specific cell reaches a specified charging value earlier. The lithium-ion secondary battery is charged until the voltage of the other cells reach the specified charging value while the current of the specific cell is bypassed by a resistor that is separately provided. In such a manner, the voltages of all of the cells are adjusted. Here, a cell balancing circuit may employ a type other than the resistive type described above and is not limited to the resistive type. The BMU 3 may also be configured to be included in the battery pack 2.

The PCS 4 is connected to an assembled battery through a power system, a switchboard and an inverter in a house, or the like. The PCS 4 may also be connected through a photovoltaic panel and inverter, or the like. The PCS 4 charges and discharges the battery while communicating with the BMU 3. Here, a case where the PCS 4 communicates with the outside, for example, a remote monitoring system 5 is postulated. There may be case where the PCS 4 is provided in the housing 1 or is separated from the housing 1. Otherwise, the PCS 4 communicates with another PCS 4 in an upper level while being provided in the housing 1. The PCS 4 has a function of monitoring system power. For example, the PCS 4 has a wattmeter and records power at each time. In addition, the PCS 4 communicates with the BMU 3 and acquires cell voltages, currents, and temperatures monitored by the BMU 3. The PCS 4 may acquire the cell voltages and temperatures in units of modules other than in units of cells. The PCS 4 has a buffer or a memory that stores data. The PCS 4 stores cell voltages, currents, and temperatures in a certain period. The PCS 4 stores a portion or the entirety of the data of the cell voltages, currents, and temperatures stored in the certain period in the remote monitoring system 5.

There may be a case where depending on the configuration of the lithium-ion secondary battery, the lithium-ion secondary battery has a unit called a system controller in addition to the PCS 4. This means that a portion of the functions of the PCS 4 is conducted by the system controller. For example, there are a function of controlling power supply through connection to a wire for system power or domestic wiring, a function of charging and discharging through communication with the BMU 3, and the like.

Figure 8:
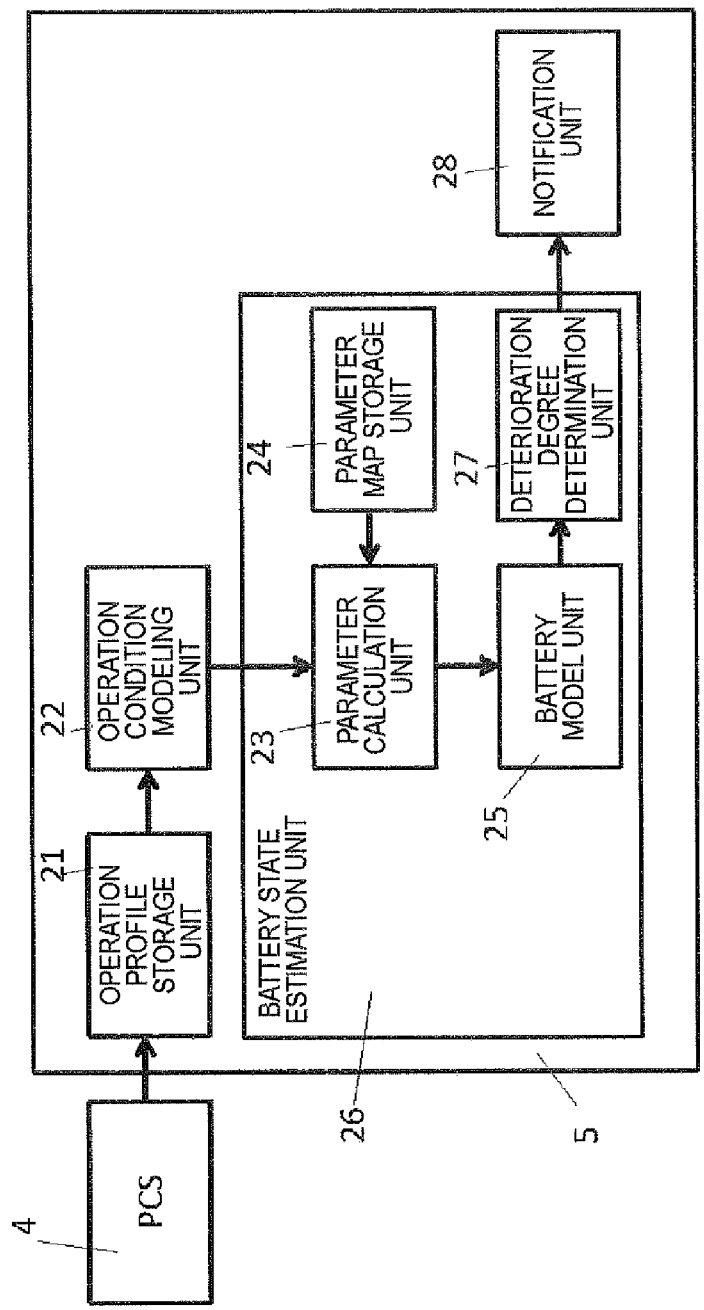
FIG. 8 shows an example of the function block diagram of a remote monitoring system of the embodiment.

The remote monitoring system 5 includes the battery state estimation device 100. FIG. 8 shows an example of the function block diagram of the remote monitoring system 5. As shown, the remote monitoring system 5 includes an operation profile storage unit 21, an operation condition modeling unit 22, a battery state estimation unit 26, and a notification unit 28. The battery state estimation unit 26 includes a parameter calculation unit 23, a parameter map storage unit 24, a battery model unit 25, and a deterioration degree determination unit 27.

The operation profile storage unit 21 and the operation condition modeling unit 22 correspond to the use environment acquisition unit 102. The parameter calculation unit 23 corresponds to the parameter estimation unit 103. The parameter map storage unit 24 corresponds to the transition information storage unit 101. The battery model unit 25 and the deterioration degree determination unit 27 correspond to the deterioration degree estimation unit 104.

In the remote monitoring system 5, the operation profile storage unit 21 stores the profiles of the cell voltages, currents, temperatures, and the like acquired from the PCS 4. The profiles of the cell voltages, currents, and temperatures are modeled in the operation condition modeling unit 22. That is, a data processing such as discretization is performed on the profiles of the cell voltages, currents, and temperatures. Hereinafter, an example of the modeling is described, and the modeling is not limited to the example.

Figure 9:
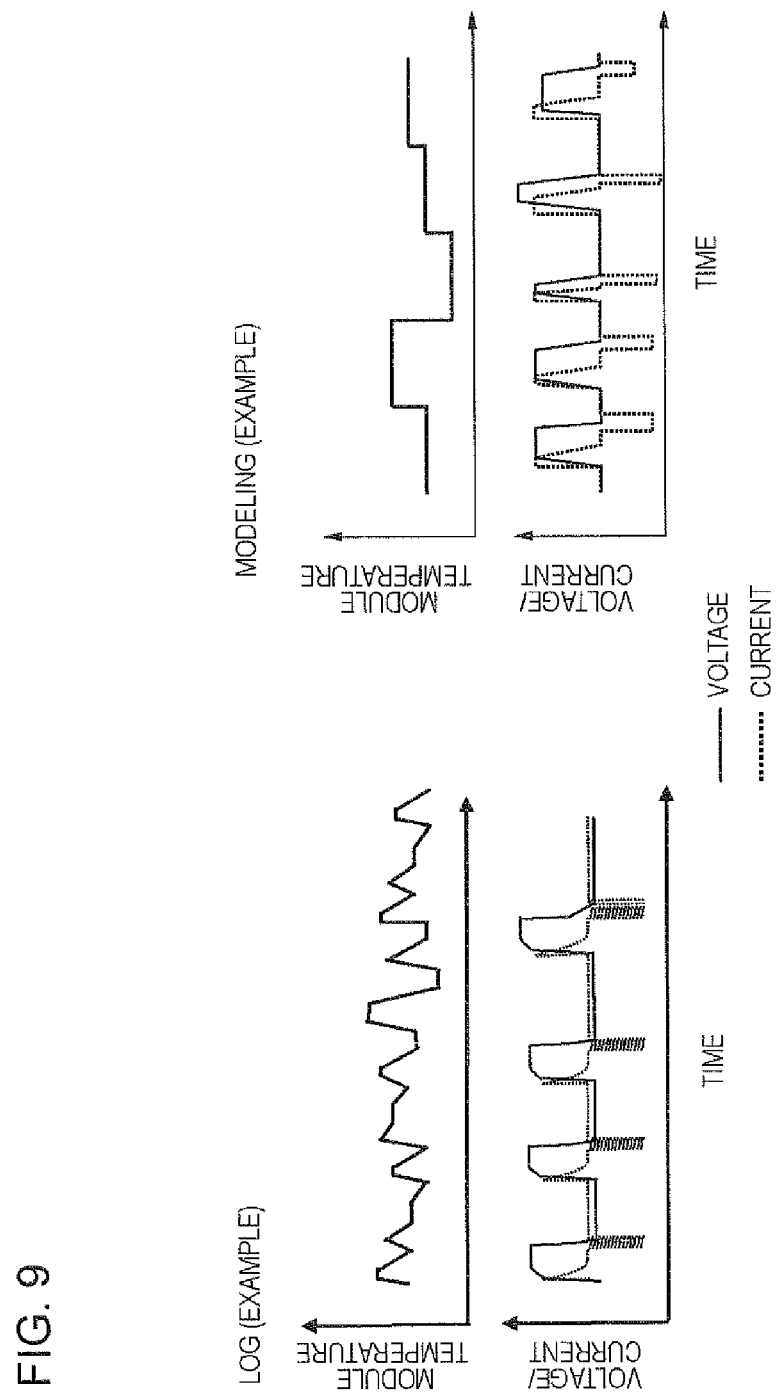
FIG. 9 is a view showing a process of an operation condition modeling unit.

First, in the modeling, operations are categorized into three modes including charge, discharge, and pause. In addition, an average temperature in each mode may be used as the temperature. For example, the current is discretized into three values by an amount obtained by dividing the rated value into two parts. For example, the voltage value is discretized into seven values by an amount obtained by dividing the rated value into six parts. In this manner, the profiles of the cell voltages, currents, and temperatures during operations are simply modeled into rectangular profiles having a plurality of discretized values. The modeled operation profiles (use environment information) are sent to the battery state estimation unit 26 while maintaining a time series relationship. Otherwise, the profiles of the cell voltages, currents, and temperatures may not be modelled and are sent to the battery state estimation unit 26 as the use environment information as they are. FIG. 9 shows an image of data after actual transitions under complex operation conditions are modelled.

The battery state estimation unit 26 estimates the state of the target battery by using the use environment information acquired from the operation condition modeling unit 22.

First, in the battery state estimation unit 26, the parameter calculation unit 23 calculates the value of a battery parameter at the time of state estimation by using the operation profile during a predetermined period. The battery parameter is, for example, the activity of the active material of the positive electrode or the negative electrode, or a mobile lithium ion amount. The parameter calculation unit 23 calculates the state of the parameter after the period (the rate of change or the amount of change in the parameter and the like), by using a parameter transition profile stored in the parameter map storage unit 24 (parameter transition information, see FIG. 2) and the operation profile. In addition, other than the mobile lithium ion amount, the stoichiometric ratio of lithium ions to the positive and negative electrode active materials at the time of the start of discharge may also be used.

The parameter map storage unit 24 stores the transition profile of each battery parameter under various conditions. As an example, a parameter transition profile (parameter transition information) under each of conditions of a temperature in a range of −5° C. to 55° C. at 10° C. intervals, a current value at 0.3 C, 0.5 C, 1 C, 2 C, and 5 C in C-rate (a current value standardized by a cell rated capacity value (Ah)), and a charge and discharge voltage range of 3.0 V to 4.2 V, 3.0 V to 4.1 V, 3.0 V to 4.0 V, 3.0 V to 3.95V, and 3.95 V to 4.2 V. An image of parameter changes stored in the parameter map storage unit 24 is shown in FIG. 2. As shown in FIG. 2, the transitions in the battery parameter states under various conditions are stored. Each of the parameter transition profiles (parameter transition information) is associated with a test method, that is, a so-called shelf test, a cycle test, or the like. Parameter transitions through a test in which pulsed charge and discharge are repeated may also be included.

The shelf test is a test in which a battery is charged to a certain voltage, is left in a state in which current supply is stopped, and is maintained in this state and the deterioration thereof is examined. In this case, the test may also be performed in a state where a voltage measurement terminal is connected or is detached. In addition, the cycle test is a test in which a battery is continuously charged and discharged in a certain voltage range and the deterioration thereof due to the repeated charge and discharge is examined.

Each parameter transition profile is obtained by separately measuring the cell characteristics of the lithium-ion secondary battery. The measurement may also be performed in units of assembled batteries such as modules other than the cell characteristics. However, for the assembled batteries, an average value of a certain type of a plurality of battery characteristics is measured. Therefore, measurement data of the characteristics of a single cell is preferable. In addition, data obtained by a deterioration test of cells which have the same composition as that of a battery cell mounted in a lithium-ion secondary battery and are different therefrom in shape, size, capacity value, and the like may also be used. However, the same type as the cell that is actually mounted is preferable.

Extraction of parameters may be performed by a method described in non-patent documents of Journal of The Electrochemical Society, Volume 154, Issue 3, p. A198, and Journal of Power Sources, Volume 196, p. 10141. As for an example, a discharge curve of the lithium-ion secondary battery is calculated by solving a diffusion equation of the active materials, a charge-exchange equation (kinetic theory, the Butler-Volmer equation) of the interface between the surface of the active materials and an electrolyte, and the like. The calculated discharge curve is dependent on the battery parameter. Here, a discharge curve calculated from the actual discharge curve is fitted by using a non-linear least-squares method, and the state of the battery parameter (the rate of change, the amount of change, and the like) is estimated.

For example, the discharge curve of each cycle is extracted from the results of the charge and discharge cycle test performed at 45° C., with 1 C, in a voltage range of 3.0 V to 4.2 V, and the battery parameter is extracted according to the parameter extraction method described in the above non-patent documents. As the number of cycle increases, the degradation of the capacity value is observed, and at the same time, a change in each battery parameter is observed. It is preferable that extraction of the parameters is separately performed in a laboratory before a large-sized lithium-ion secondary battery is shipped or within two to three years immediately after the shipment.

An actual operation profile is a combination of operation profiles in various short periods. That is, there is a case the charging temperature or discharging temperature is different from that measured the previous day even in a case where charge or discharge is performed in the same period. It is impossible to perform a deterioration test of various combinations of different operation profiles while comprehensively postulating all circumstances. Thus the transition of the battery states is estimated by connection to an operation profile simplified to a certain degree. The estimation of the battery state through connection to the operation profile is performed by connection to a parameter transition profile having different conditions.

Figure 13:
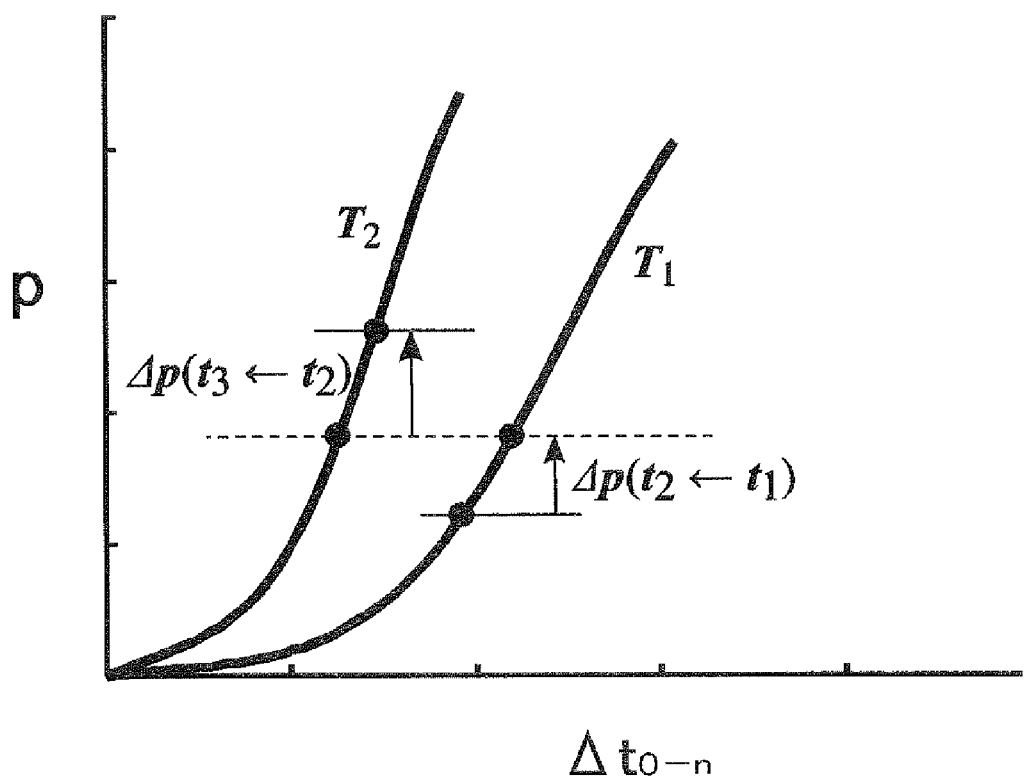
FIG. 13 is a view showing a process of a parameter calculation unit.

An example of a parameter transition connection method is described with reference to the drawings. FIG. 13 shows a transition at temperatures $T_1$ and $T_2$ of the battery parameters. The horizontal axis represents the elapsed time from the time of the start of use, and the vertical axis represents the rate of change in the battery parameter. The state (the amount of change, the rate of change, and the like) of the battery parameter is not limited to linearity with respect to time, and thus anon-linear form is generally shown. A temperature from a time $t_1$ to a time $t_2$ is $T_1$, p is changed from $p(t_1)$ to $p(t_2)$, and the amount of change is $\Delta p(t_2 \leftarrow t_1)$. Thereafter, a temperature from the time $t_2$ to a time $t_3$ is $T_2$, the parameter is changed to $p(t_3)$, and the amount of change is $\Delta p(t_3 \leftarrow t_2)$. It is assumed that charge and discharge are repeated, for example, in a range of 3.0 V to 4.2 V with 0.3 C from $t_1$ to $t_2$ and from $t_2$ to $t_3$. At this time, the battery parameter is transited on a transition curve at $T_1$ in a period from $t_1$ to $t_2$, and is transited on a transition curve at $T_2$ in a period from $t_2$ to $t_3$. During a transition from $T_1$ to $T_2$, the battery parameter is transited from $p(t_2)$ on $T_1$ to $p(t_2)$ on $T_2$.

The above description is applied to a case where a temperature is changed under the same charge and discharge conditions (voltage range and C-rate). However, even in a case where the temperature is the same or a (voltage range or C-rate Z) is changed in a case where charge and discharge conditions are changed, the parameter is connected in the same manner.

For connection to a parameter in a pause state, a change in parameter obtained by the shelf test is connected. In addition, during charging or discharging, a change in parameter obtained by the so-called charge and discharge cycle test is connected.

In addition, in a case where a parameter transition profile (parameter transition information: see FIG. 2) corresponding to a temperature that is completely equal to the temperature (operation temperature) specified by the operation profile (use environment information) acquired from the operation condition modeling unit 22 is absent, interpolation from the states (the amount of change, the rate of change, and the like) of the parameter at two upper and lower temperatures (a temperature that is higher than the operation temperature and is closest to the operation temperature, and a temperature that is lower than the operation temperature and is closest to the operation temperature) which are closest to the operation temperature is performed by using the Arrhenius rule. For example, in a case where the operation temperature is $T_a$ and the two upper and lower temperatures are $T_b$ and $T_c$ ($T_b < T_a < T_c$), $p(T_a)$ can be calculated by using $T_b$, $T_c$, $p(T_b)$, and $p(T_c)$ according to the following Expression (1). In the expression, ln represents a natural logarithm, and exp represents an exponential.

[Expression 1]

$$p(T_a) = \exp\left(\ln p(T_b) + \frac{\ln p(T_b) - \ln p(T_c)}{\frac{1}{T_b} - \frac{1}{T_c}} \times \left(\frac{1}{T_a} - \frac{1}{T_b}\right)\right) \quad (1)$$

The number of parameter transition profiles used in the case where interpolation is performed is not limited to two. For example, the state of the battery parameter (the rate of change, the amount of change, and the like) at a plurality of temperatures may be fitted to a form of the Arrhenius rule through a regression calculation or the like (see Expression (2)).

[Expression 2]

$$p(C_a) = p_0 \exp\left(-\frac{E_a}{kT}\right) \quad (2)$$

Here, $p_0$ and $E_a$ are constants, k is the Boltzmann constant ($1.381 \times 10^{-23}$ m$^2$ kg/sK), and T is the overall temperature. Fitting is performed by using $p_0$ and $E_a$ as fitting parameters.

In addition, in a case where a parameter transition profile (parameter transition information: see FIG. 2) corresponding to a C-rate that is completely equal to the C-rate (operation C-rate) specified by the operation profile (use environment information) acquired from the operation condition modeling unit 22 is absent, interpolation from the states (the rate of change, the amount of change, and the like) of the battery parameter at two upper and C-rates (a C-rate that is higher than the operation C-rate and is closest to the operation C-rate, and a temperature that is lower than the operation C-rate and is closest to the operation C-rate) which are closest to the operation C-rate is performed in the same manner. For example, in a case where the operation C-rate is $C_a$ and the two upper and lower C-rates are $C_b$ and $C_c$ ($C_b < C_a < C_c$), $p(C_a)$ can be calculated by using $C_b$, $C_c$, $p(C_b)$, and $p(C_c)$ according to the following Expression (3).

[Expression 3]

$$p(C_a) = p(C_b) + \frac{p(C_b) - p(C_c)}{C_b - C_c} \times (C_a - C_b) \quad (3)$$

The number of parameter transition profiles used in the case where interpolation is performed is not limited to two. For example, interpolation may also be performed by appropriately expanding a polynomial from several C-rate dependencies. Otherwise, depending on the type of the active materials, a deterioration mechanism model is constructed, and the state (the rate of change, the amount of change, and the like) of the battery parameter may be interpolated by fitting the parameters in the deterioration model.

In addition, in a case where a parameter transition profile (parameter transition information: see FIG. 2) corresponding to a voltage range that is completely equal to the voltage range (operation voltage range) specified by the operation profile (use environment information) acquired from the operation condition modeling unit 22 is absent, interpolation from the states (the rate of change, the amount of change, and the like) of the parameter in two upper and lower voltage ranges (for example, a voltage range of which the upper voltage limit is higher than the upper voltage limit of the operation voltage range and of which the upper voltage limit is closest to the upper limit of the operation voltage range, and a voltage range of which the upper voltage limit is lower than the upper voltage limit of the operation voltage range and of which the upper voltage limit is closest to the upper limit of the operation voltage range) which are closest to the operation voltage range is performed in the same manner. For example, in a case where the upper voltage limit of the operation voltage range is $V_a$ and the upper voltage limits of the two upper and lower voltage ranges are $V_b$ and $V_c$ ($V_b < V_a < V_c$), $p(V_a)$ can be calculated by using $V_b$, $V_c$, $p(V_b)$, and $p(V_c)$ according to the following Expression (4). The lower voltage limits are applied in the same manner.

[Expression 4]

$$p(V_a) = p(V_b) + \frac{p(V_b) - p(V_c)}{V_b - V_c} \times (V_a - V_b) \tag{4}$$

The number of parameter transition profiles used in the case where interpolation is performed is not limited to two. For example, interpolation may also be performed by appropriately expanding a polynomial from several voltage dependencies. Otherwise, depending on the type of the active materials, a deterioration mechanism model is constructed, and the p value of the battery parameter may be interpolated by fitting the parameters in the deterioration model. Thereafter, the parameter calculation unit 23 calculates the value of the battery parameter at a current point of time (at the time of state estimation) by using the calculated state (the rate of change, the amount of change, and the like) of the battery parameter.

Thereafter, the capacity value of the battery is calculated by the battery model unit 25 by using the calculated value of the battery parameter. Next, the deterioration degree of the current battery capacity is calculated by the deterioration degree determination unit 27 from the ratio to the capacity value before the operation. The calculation of the capacity value of the battery can be realized by using a technique in the related art. Hereinafter, an example is simply described.

The battery model unit 25 calculates the capacity value by using the following Butler-Volmer equation (Expression (5)), and the diffusion equation of the active materials (Expression (6)).

[Expression 5]

$$j_i = k_i c_e^{1/2} (c_{i,max} - c_{i,s})^{1/2} c_{i,s}^{1/2} \left[ \exp\left(\frac{\alpha_a F}{RT}(\Phi_i - U_i(x_i))\right) - \exp\left(-\frac{\alpha_c F}{RT}(\Phi_i - U_i(x_i))\right) \right] \tag{5}$$

$x_i$: stoichiometric number
$U_i(x_i)$: OCV
$k_i$: rate constant

[Expression 6]

$$\frac{\partial c_{i,s}}{\partial t} = \frac{1}{r^2} \frac{\partial}{\partial r}\left(D_{i,s} r^2 \frac{\partial c_{i,s}}{\partial r}\right) \tag{6}$$

$c_{i,s}$: Li$^+$ concentration in active material

Here, $U_i$ is the open voltage value of the active material, R is the gas constant (8.3145 m$^2$·kg/s$^2$·K·mol), T is the absolute temperature (K), $\alpha_a$ and $\alpha$=0.5, D is the diffusion constant of lithium ions of the active material, r is the coordinates in the active material particles, and t is time. The subscript i is p and n in the positive electrode and the negative electrode, respectively. In addition, x is the stoichiometric ratio of lithium ions to the active material, and is expressed as the following Expression (7).

[Expression 7]

$$x = \frac{c_{i,s}}{c_{i,max}} \tag{7}$$

Furthermore, the voltage value of the battery is calculated by the following Expression (8) using the potentials of the positive and negative electrodes.

[Expression 8]

$$V = \Phi_p - \Phi_n \tag{8}$$

$\Phi_i$: electrode potential

The effective activity $\varepsilon_i$ of the active material which is the battery parameter and $j_i$ in Expression (5) are shown in the following Expression (9).

[Expression 9]

$$j_i = \frac{I_{app}}{A_i} = \frac{I_{app}}{\frac{3\varepsilon_i}{r_i} V_i} \tag{9}$$

$\varepsilon_i$: fraction of active material
$V_i$: volume of active material
$A_i$: electro-active surface area The mobile lithium ion amount is calculated by using the stoichiometric ratio x according to the mathematical expression described in the non-patent document Journal of Power Sources, Volume 196, p. 10141 to 10147. In addition, as $D_i$ and $k_i$, actual measurement values obtained by using a half-cell constituted by only a positive electrode material or a negative electrode material, and a lithium counter electrode are used, or values in the paper are used. As $c_e$, $c_{i,max}$, and $r_i$, values in the paper are used. In addition, $x_i$ at the time of the start of discharge is obtained from the mobile lithium ion amount. Here, x is obtained through the mobile lithium ion amount because it is thought that it is easy to handle mobile lithium ions for the modeling of parameter transition. In a case where it is easy to model the transition of the stoichiometric ratio, the stoichiometric ratios of the positive electrode and the negative electrode may be used as they are.

Here, the calculation method is described in more detail. The calculation of the capacity value performed by using the above Expressions (5) to (9) is performed by virtually simulating a discharge process. That is, a voltage range in which the capacity value of a battery is measured is defined in advance, the voltage at the upper voltage limit is virtually discharged, and a time taken until the battery reaches the lower voltage limit is calculated.

First, a certain current value $I_{app}$ is set from a current value modeled by the operation condition modeling unit 22. When the $I_{app}$ is determined, a current density is determined by Expression (9). Since the $I_{app}$ is a constant current, the $j_i$ on the left side in Expression (5) becomes constant. In addition, the signs of the current densities $j_p$ and $j_n$ of the positive electrode are different from each other.

Thereafter, by substituting the value $\varepsilon_i$ of the battery parameter calculated by the parameter calculation unit 23 and the value of the stoichiometric ratio x of the positive and negative electrodes into Expression (5), $\Phi_i$ on the right side is calculated for the positive and negative electrodes. The output of the battery is obtained by Expression (8). However, Expression (5) is an expression for calculating a battery voltage at a certain time. In order to calculate a voltage at each time during a discharge process, Expression (6) is used.

Here, it is assumed that a voltage at a certain time t is calculated by Expression (5). After a short period of time $\Delta t$, that is, at a time $t+\Delta t$, the lithium ion concentration $c_{i,s}$ in the active material is calculated by Expression (6). $\Phi_i$ in Expression (5) is calculated by using the lithium ion concentration $c_{i,s}$.

When calculation using Expressions (5) and (6) is repeated, the voltage V of the battery gradually decreases. A time taken until the voltage V reaches the lower voltage limit from the start of discharge is calculated, and the product of the time and the $I_{app}$ becomes the estimated capacity value. The deterioration degree is calculated as a ratio of the currently estimated capacity value to the initial capacity value.

Figure 10:
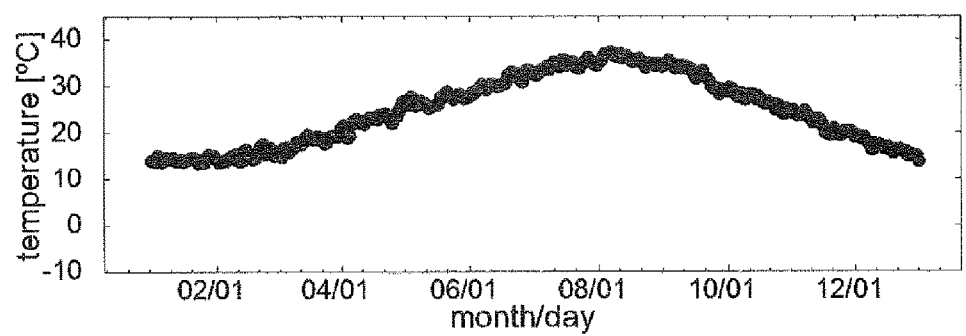
FIG. 10 is a view showing an operational effect of the embodiment.
Figure 11:
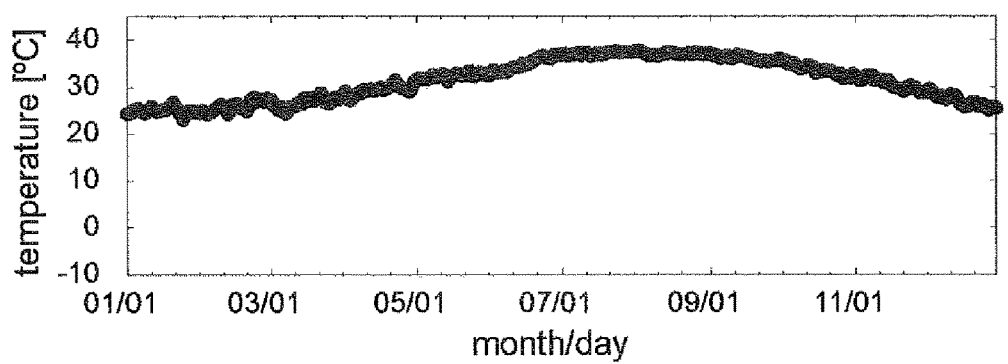
FIG. 11 is a view showing the operational effect of the embodiment.

Here, an example of state estimation performed by the simplest modeling of an actual operation profile is described. First, a module temperature is an average value per day. A battery state in two cases in which a temperature profile for one year is used in states shown in FIGS. 10 and 11 is estimated. FIGS. 10 and 11 show the transitions of a module temperature for one year in different installation places. The average temperature of FIG. 11 is higher than that of FIG. 10.

Figure 12:
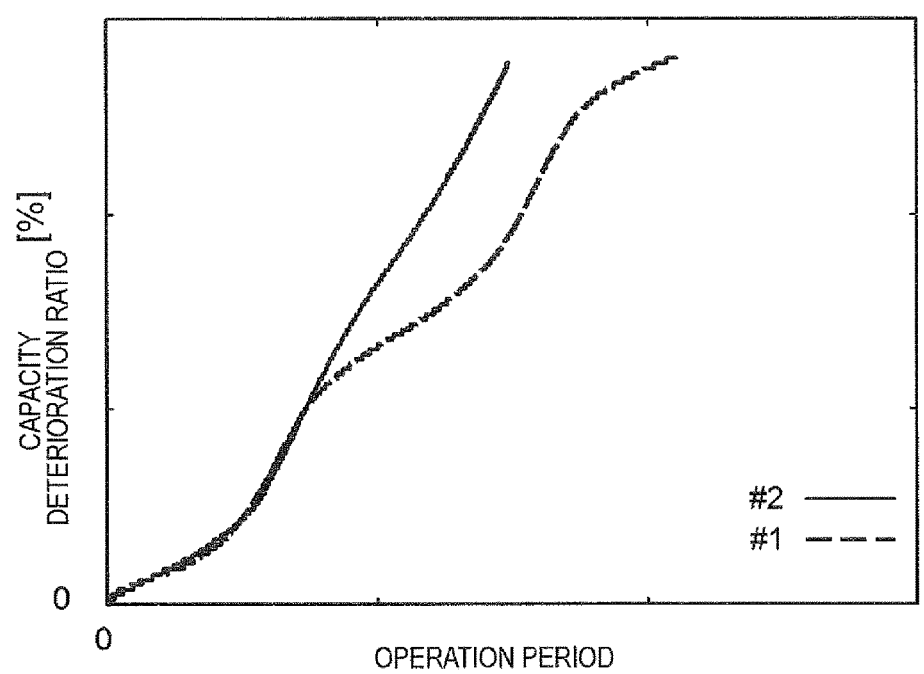
FIG. 12 is a view showing the operational effect of the embodiment.

Charge and discharge were performed once per day, and the voltage range during charge and discharge was 2.8 V to 4.2 V. An example of estimating a deterioration amount (ratio) to the initial capacity is shown in FIG. 12. The horizontal axis represents the operation time, and the vertical axis represents the deterioration rate with respect to the initial capacity. In FIG. 12, #1 and #2 are deterioration rates in the temperature profiles of FIGS. 10 and 11, respectively. It was estimated that in FIG. 11 with the higher average temperature, deterioration has more rapidly progressed.

The deterioration degree determination unit 27 calculates the ratio to the initial capacity. The ratio is output to the notification unit 28. For example, the ratio can be output via any output device such as a display, a speaker, a printer, or the like.

In addition, in a case where the ratio becomes a predetermined threshold or lower, a warning may be issued. Otherwise, a temporal transition of the ratio of the estimated capacity value to the initial capacity, or a temporal transition of the capacity estimation value may be stored in the deterioration degree determination unit 27, and a warning may be issued in a case where the rate of change therein exceeds the predetermined threshold. By the warning, a maintenance and replacement operation period may be notified to a user or an affiliated worker.

Hereinafter, reference examples are added.

1. A battery state estimation device including:
a transition information storage unit which stores a plurality of pieces of parameter transition information, each piece of the parameter transition information representing an aspect of a temporal change in a battery parameter that is changed in its state with time, the change in state influencing a battery capacity, and each piece of the parameter transition information representing the aspect of the temporal change until a predetermined state is achieved after a predetermined time that has elapsed from an initial state for each of use environments of a battery;

a use environment acquisition unit which acquires use environment information representing the use environment of a target battery which is a target of state estimation from a time of a start of use to a time of state estimation; and a parameter estimation unit which estimates the state of the battery parameter of the target battery at the time of state estimation, by using the use environment information and the parameter transition information, in which, in a case where the use environment of the target battery from the time of the start of use to the time of state estimation is changed from a first use environment to an N-th use environment (where N is an integer of 2 or more) in this order (where a P-th use environment and a (P+1)-th use environment are different use environments, and P is an integer of 1 or more and (N−1) or less), the parameter estimation unit uses a process of using the parameter transition information corresponding to the P-th use environment to estimate a P-th state which is the state of the battery parameter at a time of an end of the P-th use environment in a case where the battery parameter is used in the P-th use environment, and thereafter, using the parameter transition information corresponding to the (P+1)-th use environment to estimate a (P+1)-th state which is the state of the battery parameter at a time of an end of the (P+1)-th use environment in a case where the battery parameter in the P-th state is used in the (P+1)-th use environment, to thereby estimate an N-th state which is the state of the battery parameter at a time of an end of the N-th use environment and estimate the estimated N-th state as the state of the battery parameter of the target battery at the time of state estimation.

2. The battery state estimation device described in 1,
in which, in a case where the use environment of the target battery from the time of the start of use to the time of state estimation is changed from the first use environment to the N-th use environment (where N is an integer of 2 or more) in this order (where the P-th use environment and the (P+1)-th use environment are different use environments, and P is an integer of 1 or more and (N−1) or less), the parameter estimation unit performs a process of first using the parameter transition information corresponding to the first use environment to estimate a first state which is the state of the battery parameter at a time of an end of the first use environment in a case where the battery parameter in the initial state is used in the first use environment, and thereafter, using the parameter transition information corresponding to a Q-th use environment to estimate a Q-th state which is the state of the battery parameter at a time of an end of the Q-th use environment in a case where the battery parameter in a (Q−1)-th state is used in the Q-th use environment, once, by setting Q=2 (in a case of N=2), or repeating the process while increasing a value of Q by 1 from Q=2 until Q=N is achieved (in a case of N≥3), to thereby estimate an N-th state which is the state of the battery parameter at a time of an end of the N-th use environment and estimate the estimated N-th state as the state of the battery parameter of the target battery at the time of state estimation.

3. The battery state estimation device described in 1 or 2, further including: a deterioration degree estimation unit which estimates a degree of deterioration of the battery capacity of the target battery based on the estimated state of the battery parameter at the time of state estimation.

4. The battery state estimation device described in any one of 1 to 3, in which the transition information storage unit stores the parameter transition information corresponding to each of charge and discharge states and a pause state in which the battery is not charging or discharging, and the use environment acquisition unit acquires, as the use environment information, information representing a transition in the charge and discharge states and the pause state from the time of the start of use to the time of state estimation.

5. The battery state estimation device described in any one of 1 to 4, in which the transition information storage unit stores the parameter transition information for each of the plurality of use environments in which at least one of a current value, a voltage value, and a temperature differs from that in another use environment, and the use environment acquisition unit acquires, as the use environment information, information representing at least one transition in the current value, the voltage value, and the temperature from the time of the start of use to the time of state estimation.

6. The battery state estimation device described in any one of 1 to 5, in which the parameter estimation unit estimates an amount of change and/or a rate of change in the battery parameter from the time of the start of use to the time of state estimation, as the state of the battery parameter.

7. The battery state estimation device described in any one of 1 to 6, in which the target battery is a lithium-ion secondary battery, and the battery parameter includes at least one of an amount of an active material, an amount of mobile lithium ions, and stoichiometric ratios of positive and negative electrodes.

8. The battery state estimation device described in any one of 1 to 7, in which the battery state estimation device is provided in a housing different from that of the target battery and is configured to communicate with the target battery, and the use environment acquisition unit acquires the use environment information from the target battery.

9. The battery state estimation device described in any one of 1 to 7, in which the battery state estimation device is provided in the target battery.

10. A battery state management system including the battery state estimation device and the target battery described in 8.

11. A battery including the battery state estimation device described in 9.

12. A battery state estimation method which causes a computer to store a plurality of pieces of parameter transition information, each piece of the parameter transition information representing an aspect of a temporal change in a battery parameter that is changed in its state with time, the change in state influencing a battery capacity, and each piece of the parameter transition information representing the aspect of the temporal change until a predetermined state is achieved after a predetermined time that has elapsed from an initial state for each of use environments of a battery, and to execute a use environment acquisition step of acquiring use environment information representing the use environment of a target battery which is a target of state estimation from a time of a start of use to a time of state estimation; and a parameter estimation step of estimating the state of the battery parameter of the target battery at the time of state estimation, by using the use environment information and the parameter transition information, in which, in the parameter estimation step, in a case where the use environment of the target battery from the time of the start of use to the time of state estimation is changed from a first use environment to an N-th use environment (where N is an integer of 2 or more) in this order (where a P-th use environment and a (P+1)-th use environment are different use environments, and P is an integer of 1 or more and (N−1) or less), a process of using the parameter transition information corresponding to the P-th use environment to estimate a P-th state which is the state of the battery parameter at a time of an end of the P-th use environment in a case where the battery parameter is used in the P-th use environment, and thereafter, using the parameter transition information corresponding to the (P+1)-th use environment to estimate a (P+1)-th state which is the state of the battery parameter at a time of an end of the (P+1)-th use environment in a case where the battery parameter in the P-th state is used in the (P+1)-th use environment is used, to thereby estimate an N-th state which is the state of the battery parameter at a time of an end of the N-th use environment and estimate the estimated N-th state as the state of the battery parameter of the target battery at the time of state estimation.

12-2. The battery state estimation method described in 12, in which, in the parameter estimation step, in a case where the use environment of the target battery from the time of the start of use to the time of state estimation is changed from the first use environment to the N-th use environment (where N is an integer of 2 or more) in this order (where the P-th use environment and the (P+1)-th use environment are different use environments, and P is an integer of 1 or more and (N−1) or less), a process of first using the parameter transition information corresponding to the first use environment to estimate a first state which is the state of the battery parameter at a time of an end of the first use environment in a case where the battery parameter in the initial state is used in the first use environment, and thereafter, using the parameter transition information corresponding to a Q-th use environment to estimate a Q-th state which is the state of the battery parameter at a time of an end of the Q-th use environment in a case where the battery parameter in the (Q−1)-th state is used in the Q-th use environment, once, by setting Q=2 (in a case of N=2), or repeating the process while increasing a value of Q by 1 from Q=2 until Q=N is achieved (in a case of N≥3) is performed, to thereby estimate an N-th state which is the state of the battery parameter at a time of an end of the N-th use environment and estimate the estimated N-th state as the state of the battery parameter of the target battery at the time of state estimation.

12-3. The battery state estimation method described in 12 or 12-2, in which the computer further executes a deterioration degree estimation step of estimating a degree of deterioration of the battery capacity of the target battery based on the estimated state of the battery parameter at the time of state estimation.

12-4. The battery state estimation method described in any one of 12 to 12-3, in which the computer stores the parameter transition information corresponding to each of charge and discharge states and a pause state in which the battery is not charging or discharging, and in the use environment acquisition step, acquires, as the use environment information, information representing a transition in the charge and discharge states and the pause state from the time of the start of use to the time of state estimation.

12-5. The battery state estimation method described in any one of 12 to 12-4, in which the computer stores the parameter transition information for each of the plurality of use environments in which at least one of a current value, a voltage value, and a temperature differs from that in another use environment, and in the use environment acquisition step, acquires, as the use environment information, information representing at least one transition in the current value, the voltage value, and the temperature from the time of the start of use to the time of state estimation.

12-6. The battery state estimation method described in any one of 12 to 12-5, in which, in the parameter estimation step, an amount of change and/or a rate of change in the battery parameter from the time of the start of use to the time of state estimation is estimated as the state of the battery parameter.

12-7. The battery state estimation method described in any one of 12 to 12-6, in which, the target battery is a lithium-ion secondary battery, and the battery parameter includes at least one of an amount of an active material, an amount of mobile lithium ions, and stoichiometric ratios of positive and negative electrodes.

13. A program which causes a computer to function as a transition information storage unit which stores a plurality of pieces of parameter transition information, each piece of the parameter transition information representing an aspect of a temporal change in a battery parameter that is changed in its state with time, the change in state influencing a battery capacity, and each piece of the parameter transition information representing the aspect of the temporal change until a predetermined state is achieved after a predetermined time that has elapsed from an initial state for each of use environments of a battery;

a use environment acquisition unit which acquires use environment information representing the use environment of a target battery which is a target of state estimation from a time of a start of use to a time of state estimation; and a parameter estimation unit which estimates the state of the battery parameter of the target battery at the time of state estimation, by using the use environment information and the parameter transition information, in which, in a case where the use environment of the target battery from the time of the start of use to the time of state estimation is changed from a first use environment to an N-th use environment (where N is an integer of 2 or more) in this order (where a P-th use environment and a (P+1)-th use environment are different use environments, and P is an integer of 1 or more and (N−1) or less), the parameter estimation unit is caused to perform a process of using the parameter transition information corresponding to the P-th use environment to estimate a P-th state which is the state of the battery parameter at a time of an end of the P-th use environment in a case where the battery parameter is used in the P-th use environment, and thereafter, using the parameter transition information corresponding to the (P+1)-th use environment to estimate a (P+1)-th state which is the state of the battery parameter at a time of an end of the (P+1)-th use environment in a case where the battery parameter in the P-th state is used in the (P+1)-th use environment, to thereby estimate an N-th state which is the state of the battery parameter at a time of an end of the N-th use environment and estimate the estimated N-th state as the state of the battery parameter of the target battery at the time of state estimation.

13-2. The program described in 13, in which, in a case where the use environment of the target battery from the time of the start of use to the time of state estimation is changed from the first use environment to the N-th use environment (where N is an integer of 2 or more) in this order (where the P-th use environment and the (P+1)-th use environment are different use environments, and P is an integer of 1 or more and (N−1) or less), the parameter estimation unit is caused to perform a process of first using the parameter transition information corresponding to the first use environment to estimate a first state which is the state of the battery parameter at a time of an end of the first use environment in a case where the battery parameter in the initial state is used in the first use environment, and thereafter, using the parameter transition information corresponding to a Q-th use environment to estimate the Q-th state which is the state of the battery parameter at the time of the end of the Q-th use environment, once, by setting Q=2 (in a case of N=2), or repeating the process while increasing a value of Q by 1 from Q=2 until Q=N is achieved (in a case of N≥3), to thereby estimate an N-th state which is the state of the battery parameter at a time of an end of the N-th use environment and estimate the estimated N-th state as the state of the battery parameter of the target battery at the time of state estimation.

13-3. The program described in 13 or 13-2, in which the computer further functions as a deterioration degree estimation unit which estimates a degree of deterioration of the battery capacity of the target battery based on the estimated state of the battery parameter at the time of state estimation.

13-4. The program described in any one of 13 to 13-3, in which, the parameter transition information corresponding to each of charging or discharging states and a pause state in which the battery is not charging or discharging is stored in the transition information storage unit, and as the use environment information, information representing a transition in the charge and discharge states and the pause state from the time of the start of use to the time of state estimation is acquired by the use environment acquisition unit.

13-5. The program described in any one of 13 to 13-4, in which the parameter transition information for each of the plurality of use environments in which at least one of a current value, a voltage value, and a temperature differs from that in another use environment is stored in the transition information storage unit, and as the use environment information, information representing at least one transition in the current value, the voltage value, and the temperature from the time of the start of use to the time of state estimation is acquired by the use environment acquisition unit.

13-6. The program described in any one of 13 to 13-5, in which an amount of change and/or a rate of change in the battery parameter from the time of the start of use to the time of state estimation is estimated as the state of the battery parameter by the parameter estimation unit.

13-7. The program described in any one of 13 to 13-6, in which, the target battery is a lithium-ion secondary battery, and the battery parameter includes at least one of an amount of an active material, an amount of mobile lithium ions, and stoichiometric ratios of positive and negative electrodes.

This application is based upon and claims the benefit of priority from Japanese Patent Application No. 2013-104224, filed May 16, 2013; the entire contents of which are incorporated herein by reference.

The invention claimed is:
1. A battery state estimation device comprising:
a transition information storage device which stores a plurality of pieces of parameter transition information, each piece of the parameter transition information representing an aspect of a temporal change in a battery parameter that is changed in its state with time, the change in state influencing a battery capacity, and each piece of the parameter transition information representing the aspect of the temporal change until a predetermined state is achieved after a predetermined time that has elapsed from an initial state for each of use environments of a battery;
one or more processors configured to execute instructions to:

acquire use environment information representing the use environment of a target battery which is a target of state estimation from a time of a start of use to a time of state estimation; and estimate the state of the battery parameter of the target battery at the time of state estimation, by using the use environment information and the parameter transition information, wherein, in a case where the use environment of the target battery from the time of the start of use to the time of state estimation is changed from a first use environment to an N-th use environment (where N is an integer of 2 or more) in this order (where a P-th use environment and a (P+1)-th use environment are different use environments, and P is an integer of 1 or more and (N−1) or less), the one or more processors are configured to estimate the state of the battery parameter using the parameter transition information corresponding to the P-th use environment to estimate a P-th state which is the state of the battery parameter at a time of an end of the P-th use environment in a case where the battery parameter is used in the P-th use environment, and thereafter, using the parameter transition information corresponding to the (P+1)-th use environment to estimate a (P+1)-th state which is the state of the battery parameter at a time of an end of the (P+1)-th use environment in a case where the battery parameter in the P-th state is used in the (P+1)-th use environment, to thereby estimate an N-th state which is the state of the battery parameter at a time of an end of the N-th use environment and estimate the estimated N-th state as the state of the battery parameter of the target battery at the time of state estimation.

2. The battery state estimation device according to claim 1,
wherein, when the use environment of the target battery from the time of the start of use to the time of state estimation is changed from the first use environment to the N-th use environment (where N is an integer of 2 or more) in this order (where the P-th use environment and the (P+1)-th use environment are different use environments, and P is an integer of 1 or more and (N−1) or less), the one or more processors are further configured to execute the instructions to perform a process of first using the parameter transition information corresponding to the first use environment to estimate a first state which is the state of the battery parameter at a time of an end of the first use environment in a case where the battery parameter in the initial state is used in the first use environment, and thereafter, using the parameter transition information corresponding to a Q-th use environment to estimate a Q-th state which is the state of the battery parameter at a time of an end of the Q-th use environment in a case where the battery parameter in the (Q−1)-th state is used in the Q-th use environment, once, by setting Q=2 (in a case of N=2), or repeating the process while increasing a value of Q by 1 from Q=2 until Q=N is achieved (in a case of N≥3), to thereby estimate an N-th state which is the state of the battery parameter at a time of an end of the N-th use environment and estimate the estimated N-th state as the state of the battery parameter of the target battery at the time of state estimation.

3. The battery state estimation device according to claim 1,
the one or more processors are further configured to execute the instructions to estimate a degree of deterioration of the battery capacity of the target battery based on the estimated state of the battery parameter at the time of state estimation.

4. The battery state estimation device according to claim 1,
wherein the transition information storage device stores the parameter transition information corresponding to each of a charging or discharging state and a pause state in which the battery is not charging or discharging, and the one or more processors are further configured to execute the instructions to acquire, as the use environment information, information representing a transition in the charge and discharge states and the pause state from the time of the start of use to the time of state estimation.

5. The battery state estimation device according to claim 1,
wherein the transition information storage device stores the parameter transition information for each of the plurality of use environments in which at least one of a current value, a voltage value, and a temperature differs from that in another use environment, and
the one or more processors are further configured to execute the instructions to acquire, as the use environment information, information representing at least one transition in the current value, the voltage value, and the temperature from the time of the start of use to the time of state estimation.

6. The battery state estimation device according to claim 1,
wherein the one or more processors are further configured to execute the instructions to estimate an amount of change and/or a rate of change in the battery parameter from the time of the start of use to the time of state estimation, as the state of the battery parameter.

7. The battery state estimation device according to claim 1,
wherein the target battery is a lithium-ion secondary battery, and
the battery parameter includes at least one of an amount of an active material, an amount of mobile lithium ions, and stoichiometric ratios of positive and negative electrodes.

8. The battery state estimation device according to claim 1,
wherein the battery state estimation device is provided in a housing different from that of the target battery and is configured to communicate with the target battery,
wherein the one or more processors are further configured to execute the instructions to acquire the use environment information from the target battery.

9. The battery state estimation device according to claim 1, being provided in the target battery.

10. A battery state management system comprising the battery state estimation device and the target battery according to claim 8.

11. A battery comprising the battery state estimation device according to claim 9.

12. A battery state estimation method performed by a computer, the method comprising:
storing a plurality of pieces of parameter transition information, each piece of the parameter transition information representing an aspect of a temporal change in a battery parameter that is changed in its state with time, the change in state influencing a battery capacity, and each piece of the parameter transition information representing the aspect of the temporal change until a predetermined state is achieved after a predetermined time that has elapsed from an initial state for each of use environments of a battery;

acquiring use environment information representing the use environment of a target battery which is a target of state estimation from a time of a start of use to a time of state estimation; and estimating the state of the battery parameter of the target battery at the time of state estimation, by using the use environment information and the parameter transition information, wherein the acquiring includes, in a case where the use environment of the target battery from the time of the start of use to the time of state estimation is changed from a first use environment to an N-th use environment (where N is an integer of 2 or more) in this order (where a P-th use environment and a (P+1)-th use environment are different use environments, and P is an integer of 1 or more and (N−1) or less), using the parameter transition information corresponding to the P-th use environment to estimate a P-th state which is the state of the battery parameter at a time of an end of the P-th use environment in a case where the battery parameter is used in the P-th use environment, and thereafter, using the parameter transition information corresponding to the (P+1)-th use environment to estimate a (P+1)-th state which is the state of the battery parameter at a time of an end of the (P+1)-th use environment in a case where the battery parameter in the P-th state is used in the (P+1)-th use environment is performed, to thereby estimate an N-th state which is the state of the battery parameter at a time of an end of the N-th use environment and estimate the estimated N-th state as the state of the battery parameter of the target battery at the time of state estimation.

13. A non-transitory computer-readable storage medium storing a program that, when executed by a computer, causes the computer to function as perform a method, the method comprising:

storing a plurality of pieces of parameter transition information, each piece of the parameter transition information representing an aspect of a temporal change in a battery parameter that is changed in its state with time, the change in state influencing a battery capacity, and each piece of the parameter transition information representing the aspect of the temporal change until a predetermined state is achieved after a predetermined time that has elapsed from an initial state for each of use environments of a battery;

acquiring use environment information representing the use environment of a target battery which is a target of state estimation from a time of a start of use to a time of state estimation; and estimating the state of the battery parameter of the target battery at the time of state estimation, by using the use environment information and the parameter transition information, wherein the acquiring includes, in a case where the use environment of the target battery from the time of the start of use to the time of state estimation is changed from a first use environment to an N-th use environment (where N is an integer of 2 or more) in this order (where a P-th use environment and a (P+1)-th use environment are different use environments, and P is an integer of 1 or more and (N−1) or less), using the parameter transition information corresponding to the P-th use environment to estimate a P-th state which is the state of the battery parameter at a time of an end of the P-th use environment in a case where the battery parameter is used in the P-th use environment, and thereafter, using the parameter transition information corresponding to the (P+1)-th use environment to estimate a (P+1)-th state which is the state of the battery parameter at a time of an end of the (P+1)-th use environment in a case where the battery parameter in the P-th state is used in the (P+1)-th use environment, to thereby estimate an N-th state which is the state of the battery parameter at a time of an end of the N-th use environment and estimate the estimated N-th state as the state of the battery parameter of the target battery at the time of state estimation.

\* \* \* \* \*